(12) United States Patent
Klaver et al.

(10) Patent No.: US 9,923,445 B2
(45) Date of Patent: Mar. 20, 2018

(54) DRIVE FOR AN XY-TABLE AND XY-TABLE

(71) Applicant: DR. JOHANNES HEIDENHAIN GMBH, Traunreut (DE)

(72) Inventors: René Klaver, NK Eindhoven (NL); John Compter, AC Rockanje (NL)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 346 days.

(21) Appl. No.: 14/755,600

(22) Filed: Jun. 30, 2015

(65) Prior Publication Data

US 2015/0381023 A1 Dec. 31, 2015

(30) Foreign Application Priority Data

Jun. 30, 2014 (EP) .................... 14174983

(51) Int. Cl.
*H02K 41/035* (2006.01)
*F16C 32/04* (2006.01)
*G03F 7/20* (2006.01)

(52) U.S. Cl.
CPC ....... *H02K 41/035* (2013.01); *F16C 32/0472* (2013.01); *G03F 7/70758* (2013.01); *G03F 7/70816* (2013.01); *H02K 41/0356* (2013.01); *H02K 2201/18* (2013.01)

(58) Field of Classification Search
CPC ............. H02K 41/035; H02K 41/0356; H02K 2201/18; F16C 32/04
USPC .............. 310/12.05, 12.06, 12.18, 90.5, 181, 310/216.023, 216.024, 216.025
IPC ................................ H02K 41/035; F16C 32/04
See application file for complete search history.

(56) References Cited

U.S. PATENT DOCUMENTS

| 4,504,750 | A | * | 3/1985 | Onodera | H02K 41/033 310/12.05 |
|---|---|---|---|---|---|
| 4,995,744 | A | * | 2/1991 | Goldowsky | B41J 9/38 101/93.05 |
| 6,859,122 | B2 | * | 2/2005 | Divoux | F04B 43/043 29/607 |
| 6,879,063 | B2 | | 4/2005 | Frissen et al. | |
| 7,683,506 | B2 | * | 3/2010 | Watson | H02K 41/02 104/281 |
| 2002/0109828 | A1 | * | 8/2002 | Moors | G03F 7/70558 355/76 |
| 2008/0296983 | A1 | | 12/2008 | Watson | |
| 2012/0212723 | A1 | * | 8/2012 | Hol | H01F 7/081 355/67 |
| 2015/0381023 | A1 | * | 12/2015 | Klaver | F16C 32/0472 310/12.06 |

FOREIGN PATENT DOCUMENTS

EP 2 492 928 8/2012
WO 98/37335 8/1998

* cited by examiner

*Primary Examiner* — John K Kim
(74) *Attorney, Agent, or Firm* — Andrews Kurth Kenyon LLP

(57) ABSTRACT

A drive for an XY-table includes a stationary, ferromagnetic and U-shaped yoke including a first limb and a second limb which are located together in one plane, and having a movable ferromagnetic bar, the yoke and the bar carrying a magnetic circuit with a flux that takes a path across air gaps between the limbs and the bar, and causes vertical reluctance forces there which counteract the gravitational force of the bar. Bar is parallel to and below the plane defined by the limbs.

15 Claims, 5 Drawing Sheets

DRIVE FOR AN XY-TABLE AND XY-TABLE

CROSS-REFERENCE TO RELATED APPLICATIONS

The present application claims priority to Application No. 14174983.8, filed in the European Patent Office on Jun. 30, 2014, which is expressly incorporated herein in its entirety by reference thereto.

FIELD OF THE INVENTION

The present invention relates to a drive for an XY-table that is able to be positioned in two extended directions of one plane and, within certain limits, in a direction perpendicular to the plane and with regard to rotations of the table about the three linear directions.

BACKGROUND INFORMATION

Exact positioning of tables in two directions of one plane under closed-loop control, as well as the closed-loop control of the position of the table in a direction perpendicular to the plane and with regard to rotations of the table about the three linear directions is, above all, an important requirement in the manufacture of semiconductors. In that case, a wafer placed on the table must be positioned under a tool such as the lens of an exposure apparatus, the objective lens of a microscope, or an electron-beam lens for processing or inspecting the wafer. In conjunction with a stationary tool, the table must be able to execute movements in the wafer plane on the order of magnitude of the wafer itself. At least small corrections are necessary perpendicular to that and with regard to all possible tilts to permit compensation for variations in the thickness of the wafer, for example, or deviations in the parallelism of the front side and back side of the wafer.

In this field of technology, practical applications are familiar for which the table is moved back and forth in a horizontal direction in individual swaths over the width of the wafer, after each crossing of the wafer, a jump being made to another swath, so that the wafer is scanned by the tool in meander-shaped paths. In so doing, the velocity of the table is constant within one swath. In this context, large forces are necessary primarily for the direction reversal at the end of each swath. Apart from that, the drives only have to permit small position correction movements and keep the velocity of the table constant.

Tables of the kind which are moved by magnetic force and are held in suspension (what are termed Maglev stages) are especially suitable for manufacturing semiconductors because, due to the fact that mechanical supports are not used, these tables cause only very few disturbing particles, making them especially appropriate for clean rooms.

An example for such a table is described in U.S. Pat. No. 6,879,063, in which the table moves via a planar array of magnets. At its underside, the table has coils, via which, upon being suitably traversed by current, the table may be moved in all six degrees of freedom. However, tables of this type are not optimized for the special movement pattern described above, since their drives are unnecessarily heavy (because the large forces for accelerating are not necessary over the whole working area), and as a consequence, additional masses must be moved. In addition, the supply cables necessary for the moving coils are disadvantageous for a precise positioning. The heat generated in the coils moved with the table can be a problem for many applications. The fields of the magnets may also be disadvantageous for various practical applications, as in ion-beam or electron-beam applications.

A magnetic bearing, with which a load is able to be held in the vertical direction and positioned over small distances, and at the same time may be moved in the horizontal direction is described in PCT International Published Patent Application No. WO 98/37335. A U-shaped yoke is used as a stator, having two parallel limbs disposed above and below a movable, ferromagnetic bar. Integrated in the closed end of the U-shape of the yoke is a permanent magnet whose magnetic flux is guided along the limbs, the magnetic circuit being closed across the air gaps between the yoke and the bar. The reluctance forces occurring in this instance counteract the gravitational force of the bar and may be regulated with the aid of a coil, which is able to weaken or strengthen the field of the magnet, for the vertical fine positioning of the bar. In addition, a further coil, which is wound on one of the limbs of the yoke, makes it possible to exert a horizontal force on the bar. Several such configurations of yoke and bar, disposed relative to each other in various directions, permit the positioning of the bars and an object joined to the bars in all six degrees of freedom. The masses moved by the drive—e.g., the bars—are very small. The drive is of the moving iron type, in contrast to drives with moving coils or moving magnets.

Drives of this type have the disadvantage, however, that due to the relatively complex configuration of moving and non-moving parts meshing with each other, integrating such drives into an XY-table is relatively intricate.

SUMMARY

Example embodiments of the present invention provide an improved drive for an XY-table, which is mechanically easier to integrate in comparison to conventional systems.

According to example embodiments of the present invention a drive for an XY-table includes a stationary, ferromagnetic and U-shaped yoke including a first limb and a second limb which lie together in a plane, and having a movable ferromagnetic bar, the yoke and the bar carrying a magnetic circuit with a flux that takes a path across air gaps between the limbs and the bar, and generates vertical reluctance forces there which counteract the gravitational force of the bar. The bar is located parallel to and below the plane defined by limbs.

A plurality of such drives may be connected particularly easily to an XY-table, to make it possible to adjust all degrees of freedom of the XY-table.

The drive for the XY-table is of the moving iron type. This means that only a little additional mass must be moved with the table. Cooling for the table or an electrical-energy supply is not necessary. No element generating a magnetic field is located on the moving table either, as is the case for, e.g., conventional planar motors, in which either magnets or coils are mounted directly on the table.

The drive is a direct drive operating contactlessly. It requires no gear unit and generates no disturbing particles. The drive is formed of only a small number of simple components, and is therefore inexpensive and uncomplicated to construct and to maintain. The drive assembles very flat, so that it takes up only a little space vertically (perpendicular to the table plane). This holds true above all if the drive is compared to a conventional XY-table, which is constructed with two crossed linear axes stacked one on top of the other.

Further features and aspects of example embodiments of the present invention are described in more detail below with reference to the appended Figures.

DETAILED DESCRIPTION

Figure 1:
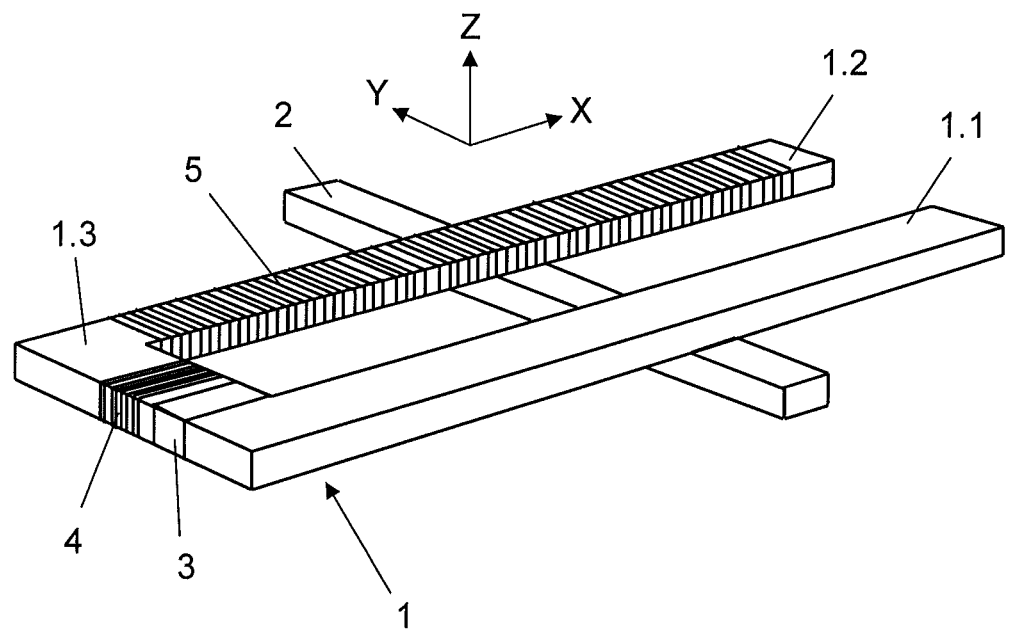
FIG. 1 is a perspective view of a drive for an XY-table.

FIG. 1 is a perspective view of a drive for an XY-table. The drive includes a stationary U-shaped yoke 1 made of a material of high permeability and having a first limb 1.1 and a second limb 1.2, as well as a closed end 1.3 which joins the two limbs to form a U.

Extending transversely to limbs 1.1, 1.2 is a ferromagnetic bar 2 which is movable relative to yoke 1. In each case, an air gap is located at the points of intersection between bar 2 and limbs 1.1, 1.2, by which yoke 1 and bar 2 are separated from each other.

In the closed end 1.3 of the yoke 1, a permanent magnet 3 is disposed, which causes a magnetic flux through parts of yoke 1 and bar 2. The closed magnetic circuit takes a path across the two air gaps and is self-contained. A first coil 4, which likewise is located in the closed end 1.3 of the yoke 1 and is wound around yoke 1, makes it possible to increase or decrease the magnetic flux through yoke 1 and bar 2 depending on the strength and direction of a current flowing through first coil 4. It is possible to dispense with the magnet 3 by using an additional constant current in the first coil 4, generating a magnetic field equivalent to the field of a magnet 3, but this option is much less power efficient.

The magnetic reluctance in this magnetic circuit is particularly high in the air gaps, and its value depends on the position of the bar. A reluctance force therefore takes effect which strives to reduce these air gaps. If limbs 1.1, 1.2 lie in a horizontal plane, and if bar 2 is disposed in the vertical direction below yoke 1, then the reluctance force counteracts at least the weight force of bar 2 and any part connected to the bar 2. Given suitable closed-loop control of the current through first coil 4, the air gap is able to be kept constant and thus the weight force of bar 2 (and any part connected to it) is able to be compensated for. Bar 2 hangs in the air below yoke 1, and within certain limits, may also be positioned in terms of its vertical position in the Z-direction. To that end, with the aid of a suitable controller structure, the current through first coil 4 is influenced such that the air gap, i.e., the vertical position of the bar, is adjusted to a setpoint value. In addition, the controller structure can be used to counteract disturbance forces acting upon bar 2, e.g., caused by acoustics and air flow.

In order to likewise be able to position bar 2 in extension direction X of limbs 1.1, 1.2 of yoke 1, also denoted as X-direction, a second coil 5 is wound about second limb 1.2. So long as bar 2 is located below this second coil 5, a current through this second coil 5 crosses the magnetic flux through the air gap at the point of intersection between second limb 1.2 and bar 2. A component of the Lorentz reaction force (to be more precise: a force predominantly of the Lorentz type) acts in the X-direction on bar 2, the force being adjustable according to the amount and direction by the current in second coil 5. In order to make the possible travel range of bar 2 as large as possible, second coil 5 is wound on the entire length of second limb 1.2.

Regarding the placement of magnet 3 and first coil 4 at the closed end 1.3 of yoke 1, the closed end 1.3 refers to that part of the yoke 1 that carries no second coil 5 and lies outside the moving range of the bar 2. In addition to the bottom of the U, also parts of the first and second limbs 1.1, 1.2 close to the bottom may be suitable for placing the first coil 4 and magnet 3, and are also referred to as the closed end of U-shaped yoke 1.

Figure 2:
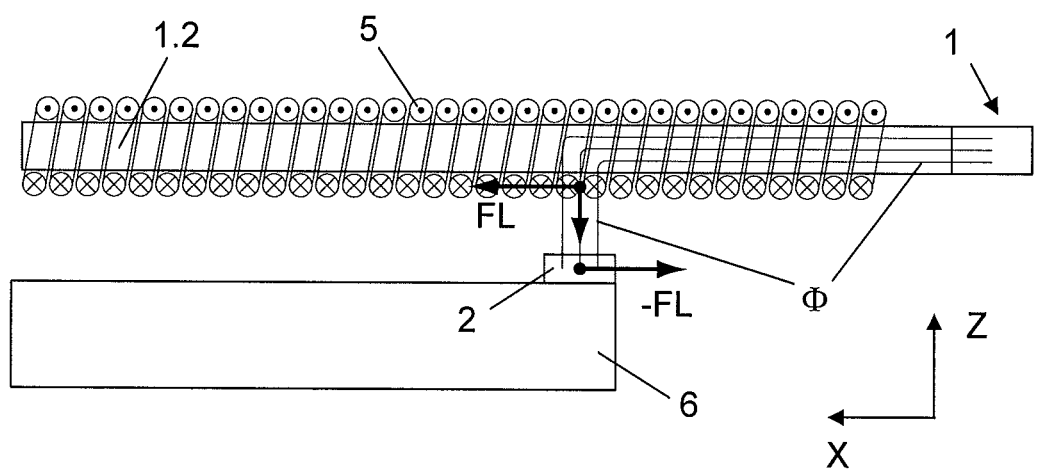
FIG. 2 is a cross-sectional view of a drive for an XY-table.

It is an option to split the coil 5 in several parts which carry current or no current depending on the position of bar 2, which has the advantage of a reduction of the losses in second coil 5. It is another option to use an additional coil on the first limb 1.1, similar to the second coil 5 on the second limb 1.2. FIG. 2 is a cross-sectional view through second limb 1.2, viewed in the X-Z plane. The current in second coil 5 crosses with magnetic flux $\Phi$ in the air gap, and in so doing, causes a Lorentz force in the X-direction, whose counterforce-FL acts on bar 2.

By a suitable controller structure, currents through the two coils 4 and 5 are thus able to be adjusted, by which bar 2 may be positioned both vertically in the Z-direction and horizontally in the X-direction along limbs 1.1, 1.2. As changing the current through either the first coil 4 or the second coil 5 always has an effect on both the horizontal and vertical forces, such a controller structure must account for this interdependence of horizontal and vertical forces. For example, if a force in the horizontal direction X is needed, a current through second coil 5 has to be switched on. This current changes the flux $\Phi$ in the air gaps, and thus the vertical force. This has to be counteracted by a current through the first coil 4, because otherwise the vertical position of limb 2 would change.

If, as illustrated in FIG. 2, a table 6 is connected to at least three bars 2 which extend in different directions and which, in each case, cross a U-shaped yoke 1 having two coils 4 and 5, all six degrees of freedom of a table 6 are able to be adjusted by a total of six coil currents. Table 6 needs no mechanical support. It is held contactlessly in suspension and may be positioned in a horizontal plane.

Figure 3:
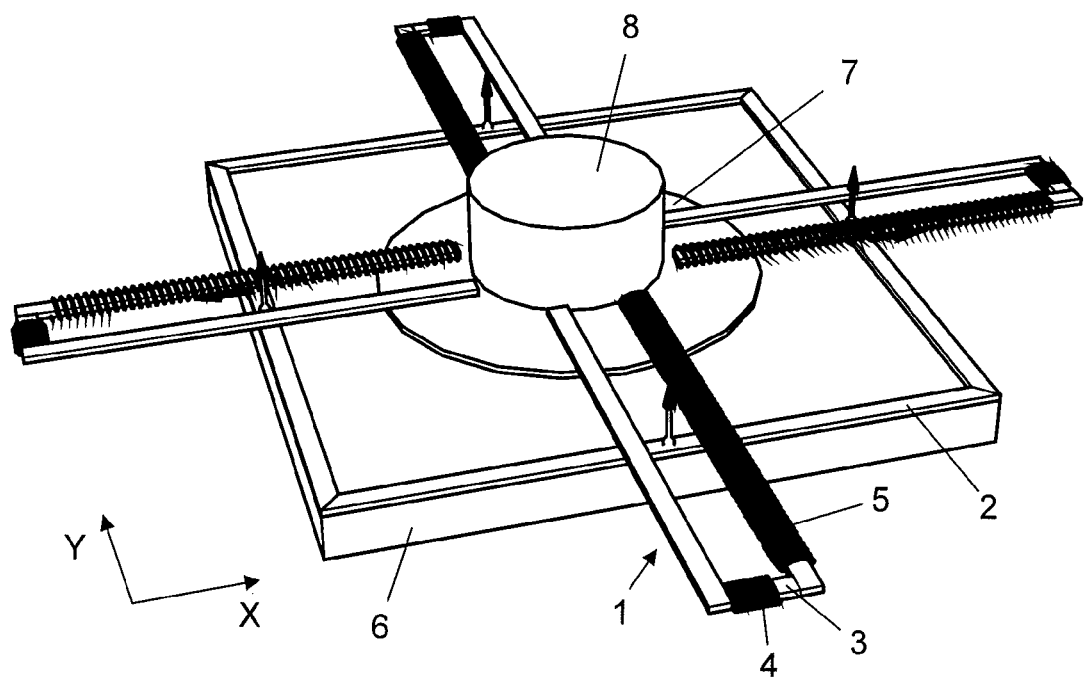
FIG. 3 is a perspective view of an XY-table having four drives.

An example for such an arrangement is illustrated in FIG. 3. One bar 2 each is disposed along each outer edge of a movable rectangular table 6. Placed above bars 2—in each case intersecting bars 2 at right angles—are four stationary U-shaped yokes 1, each of which has a magnet 3 and first and second coils 4, 5, as explained above. A wafer 7, which is to be processed by a stationary tool 8, is placed on table 6. For example, tool 8 may be a microscope for inspecting wafer 7, or perhaps a device for exposing a photo-resist, applied on the wafer, to light.

The surface of table 6 holding the wafer 7 is parallel to the plane XY of the yokes 1 of the drives. As with all references to parallelism herein, parallelism in a mathematical sense cannot technically be reached. A deviation from perfect parallelism in the order of a degree may not be detrimental in most cases.

The limbs of yokes 1 and the second coils 5 wound on them are in each case of sufficient length, so that table 6, and with it, wafer 7 may be displaced so far in the X-direction and Y-direction, that tool 8 is able to reach every point of wafer 7. The length of bars 2 ensures that each of the four drives is able to apply a horizontal force in the X-direction or Y-direction and a vertical force in the Z-direction at any time, regardless of the instantaneous position of the table 6.

The small movements in the Z-direction likewise possible with all four drives permit a shift of table 6 in the Z-direction, or a tilt about the X-direction or Y-direction. A rotation about the Z-axis may be achieved, since second coils 5, in each case situated opposite each other, are offset laterally relative to each other by the width of one yoke 1, and thus are able to generate a torque about the Z-direction.

Therefore, given suitable control of the four drives, table 6 is able to be positioned in all 6 degrees of freedom by a total of 8 currents to be regulated.

For example, the maximum vertical force of an individual drive may be in the range of, e.g., a few 10 N. Thus, four such drives are able to hold a table 6 in suspension whose weight, including bars 2 and its payload, is on the order of, e.g., 10 kg.

On the other hand, the Lorentz forces achieved in the horizontal direction are markedly smaller, for example, by one order of magnitude. The resulting, relatively small, maximum acceleration in the horizontal direction is discussed below.

First of all, a further exemplary embodiment will be described with reference to FIG. 4. The four drives for table 6 are illustrated only schematically. They are constructed like in the previously-described exemplary embodiments. However, all four yokes 1 and their limbs 1.1, 1.2 extend along the X-direction. Bars 2 are shortened considerably and are disposed in the corners of table 6, and to be more precise, such that they intersect the yokes at an angle other than 90 degrees. The vertical (reluctance) forces are only influenced to a limited extent by this rotation of bars 2 relative to yokes 1. The horizontal Lorentz forces have components that are perpendicular to bars 2.

This arrangement allows the creation of forces and the positioning of the table 6 in X and Y directions. The shape of the configuration, reduced in the Y-direction and stretched in the X-direction, reduces the outer dimensions of the drive and so also the outer dimension of the full equipment.

Figure 4:
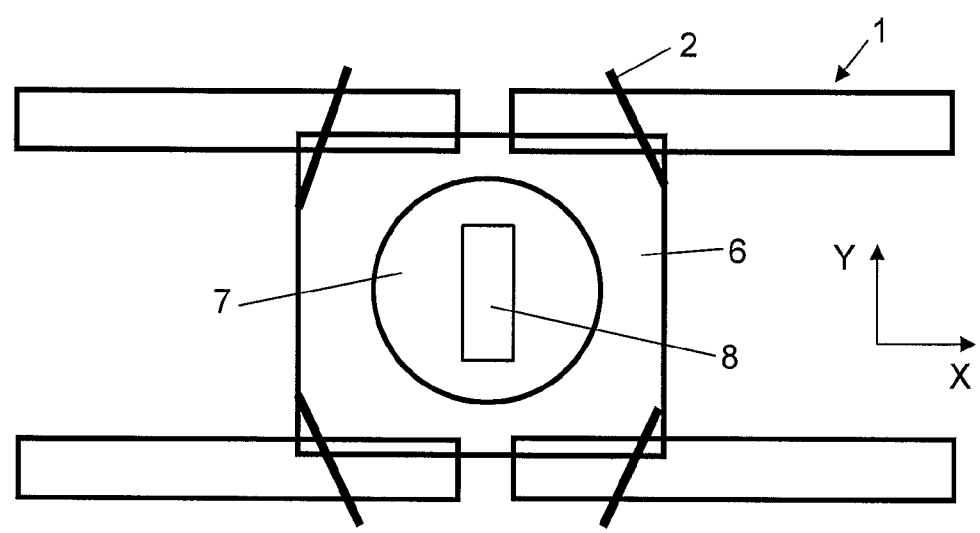
FIG. 4 is a plan view of an XY-table having an alternative configuration of the drives.

An example for a practical application in which a configuration as illustrated in FIG. 4 may be used is a processing apparatus whose tool 8 already covers a large part of wafer 7 in the Y-direction, so that only a small operating range is necessary in the Y-direction, while in the X-direction, the entire diameter of wafer 7 must be traveled. In such an application, it is not troubling that the placement of the drives shown has a reduced operating range in the Y-direction. In this instance, the configuration has the advantage that it is smaller in the Y-direction compared to the configuration illustrated in FIG. 3.

As mentioned above, the horizontal forces able to be attained by the drives described herein are relatively limited. Practical applications for which a wafer 7 must be scanned swath-by-swath, for which the wafer thus travels a swath with constant (and highest possible) velocity, then reverses its direction of movement (also referred to as direction reversal) at the end of each swath, jumps to another swath and travels the next swath in the opposite direction, require above all the highest possible acceleration and correspondingly large forces for the direction reversal, whereas otherwise, only friction must be overcome and potential smaller corrections in position or velocity must be made using small forces. The small forces may be applied relatively easily using the drives described above, or perhaps using other, e.g., conventional drives. It therefore is advantageous if separate drives are available which are specialized for the process of reversing direction, and which only have to be active during this brief time span. The drives for the linear movement may be dimensioned smaller accordingly.

Figure 5:
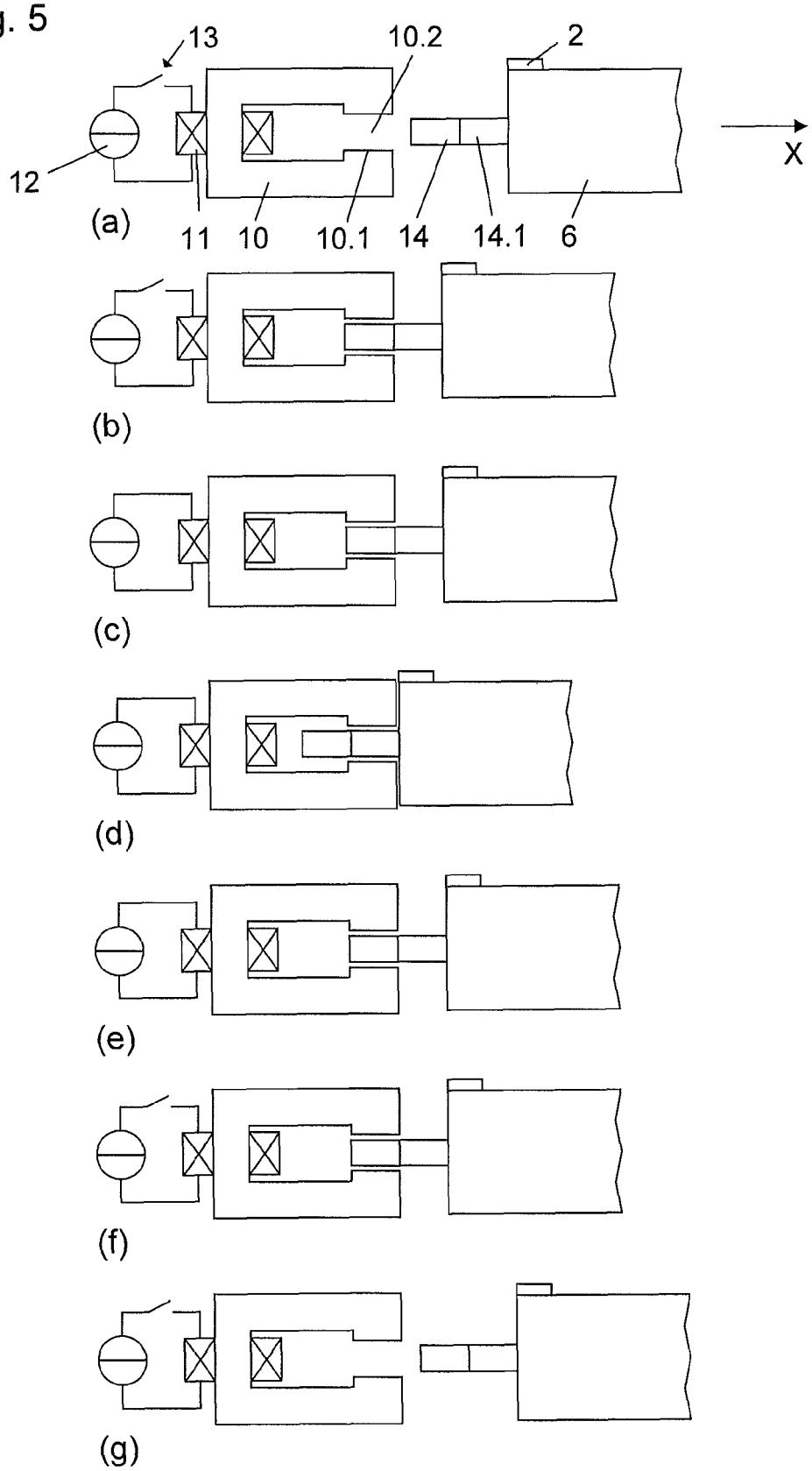
FIG. 5 illustrates an XY-table having a separate drive for direction reversal, depicted at various moments during a direction reversal.

FIG. 5 illustrates an XY-table 6 having a separate drive for reversing the direction of the table. First of all, the basic structure of this separate drive will be explained in greater detail with reference to the portion of FIG. 5 labeled (a).

At the top edge of table 6, which is movable in the X-direction, a bar 2 is secured for a drive of the type described above. However, the associated U-shaped yoke 1 is not shown.

At the outer edge of table 6, a projecting, ferromagnetic rib 14 is attached, which extends perpendicular to direction of movement X to be reversed. A magnetic yoke 10 is disposed at the outer end of the motion range of table 6. This magnetic yoke 10 has a reversal coil 11 which is connected to a voltage or current source 12 via a switch 13.

On the side facing table 6, magnetic yoke 10 has a pair of pole shoes 10.1 which concentrate a magnetic flux, generated with the aid of reversal coil 11, in an air gap 10.2. This air gap 10.2 is shaped such that it is able to receive ferromagnetic rib 14 of table 6, so that rib 14 is able to move through air gap 10.2 and emerge again on its side facing away from the table 6—this position is illustrated in the portion of FIG. 5 labeled (c). Magnetic yoke 10 does not necessarily have to be C-shaped. It is only important that a switchable, highest possible magnetic flux is able to be generated in air gap 10.2, and that ferromagnetic rib 14 is able to extend through air gap 10.2, far enough into magnetic yoke 10. For this, the limbs of yoke 10 must be of sufficient length in the X-direction. Another example embodiment avoiding this limitation is explained with reference to FIG. 6 below.

To permit rib 14 to penetrate far enough into magnetic yoke 10, rib 14 is additionally disposed on a non-ferromagnetic projection 14.1 of table 6. This projection must be formed such that, like rib 14, if fits between pole shoes 10.1.

Figure illustrates the time sequence of a direction reversal in detail. Initially (a), no current flows in reversal coil 11. There is no magnetic flux in air gap 10.2 between pole shoes 10.1. Table 6, and with it, rib 14, moves in the negative X-direction toward air gap 10.2.

Only when rib 14 has completely entered into air gap 10.2 (b) is switch 13 closed (c), and a magnetic flux builds up in air gap 10.2, which permeates rib 14. However, since table 6 continues to move unbraked, the rib advances into the interior of magnetic yoke 10, and in so doing, leaves air gap 10.2 at the side of air gap 10.2 facing away from table 6 (d).

However, this leads to an increase in the magnetic reluctance of air gap 10.2, and consequently to a reluctance force which counteracts the movement. This reluctance force urges rib 14 back into air gap 10.2. It therefore counteracts the direction of movement of table 6 and leads ultimately to the direction reversal desired. For example, for a typical practical application, a distance of, e.g., 5 cm may be assumed which table 6, and thus rib 14 still cover after the magnetic flux has been switched on, before a direction reversal takes place. This distance must be taken into account in the configuration of the separate drive for the direction reversal.

Accelerated by the reluctance force, rib 14 travels back into gap 10.2 (e) after the direction reversal. At that moment, switch 13 is opened again (f), and rib 14 leaves air gap 10.2, in the positive X-direction (g). Reluctance forces do not occur upon leaving the air gap, since the magnetic flux is already switched off again.

Rib 14 thus enters air gap 10.2 from the side facing table 6 and emerges from air gap 10.2 again on the side facing away from the table. There, a reluctance force causes the direction reversal. The rib travels through air gap 10.2 once more in the opposite direction. When it leaves it, the direction reversal is complete.

Figure 6:
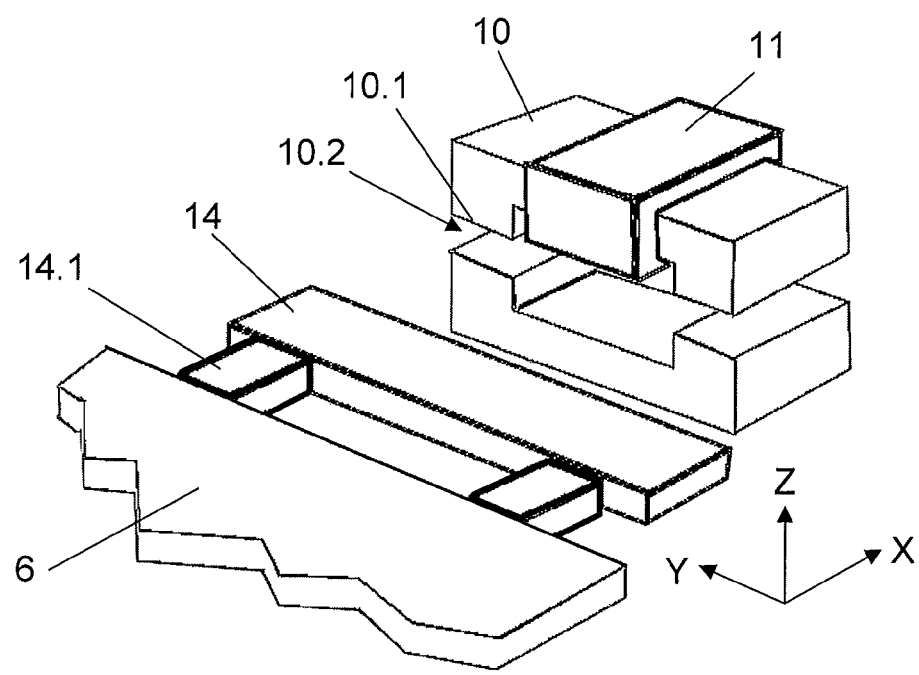
FIG. 6 is a perspective view of the separate drive for direction reversal.

FIG. 6 shows another example embodiment of a separate drive for reversing the direction of movement of the table 6. A two-part yoke 10 with two air gaps 10.2 and two pairs of pole shoes 10.1 is used. In this configuration, yoke 10 is open on its side facing away from table 6. Nevertheless, this side of the yoke facing away from table 6 is referred to as the interior of yoke 10, as in the previous example embodiment illustrated in FIG. 5. Similar parts are numbered in the same manner as in FIG. 5. This example embodiment functions in the same manner as explained above with reference to FIG. 5.

Because the drive for the direction reversal is separate from the actual XY-drive for table 6, the force paths of the two drives are different. The large forces needed to reverse the direction of movement of the table, or their reaction forces, are able to be picked up by balance masses, or may be guided via separate force frames to the floor, such that they have no negative effect on the table or the tool.

A particular advantage of this separate drive for reversing the direction of an XY-table is that the drive is only active at the instant of the direction reversal. At that moment, usually no machining processes are taking place on wafer 7 placed on table 6. This is especially important when the machining would be disturbed by external magnetic fields, thus, for instance, in the case of electron-beam lithography or other maskless exposure processes.

Source 12 must make high currents available for reversal coil 11 for a short time. A suitable form for such a current source is a capacitor which is charged between the individual direction-reversal events, and which outputs its energy to reversal coil 11 upon closure of switch 13. The energy stored in the capacitor is ultimately used to reverse the direction of table 6.

Figure 7:
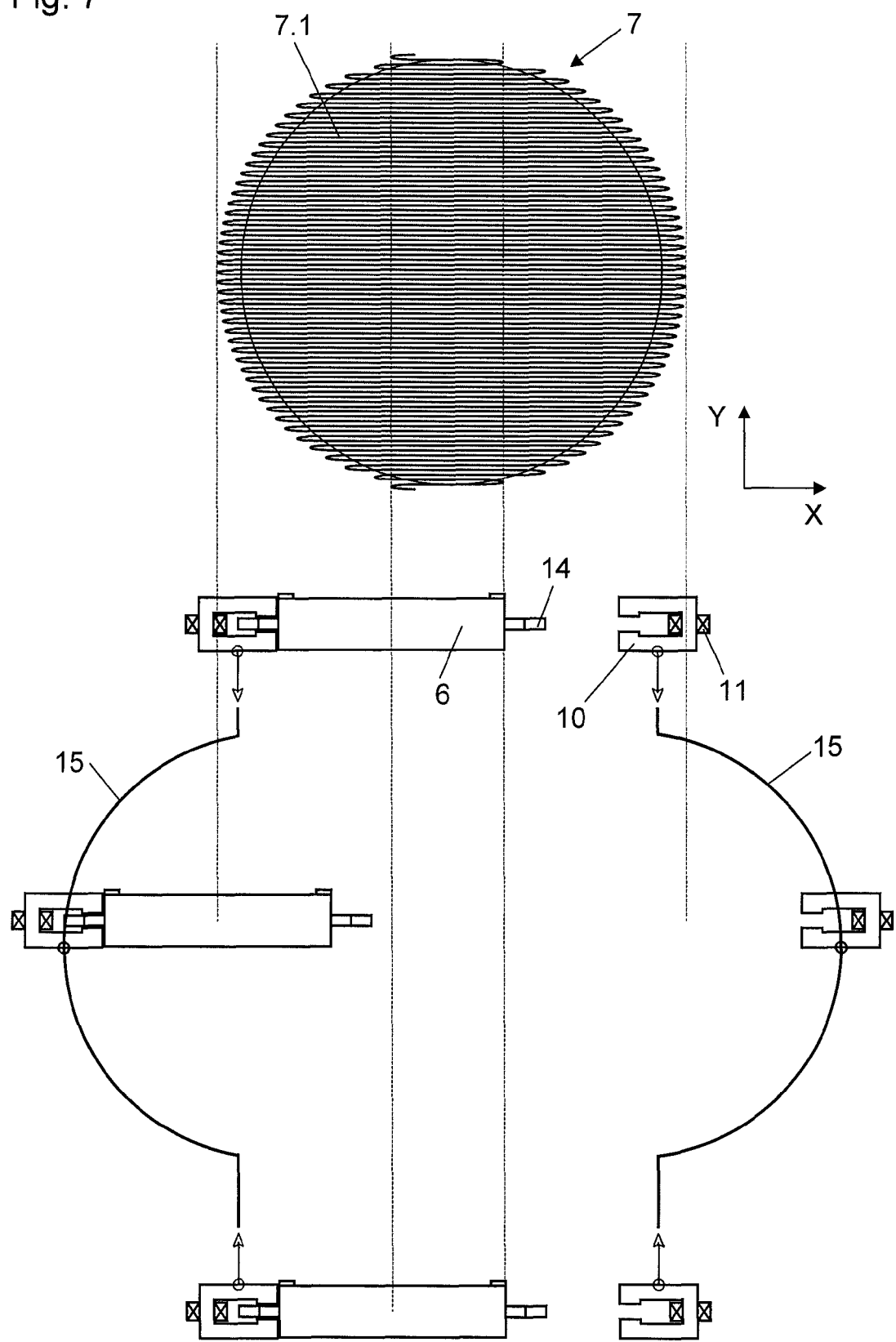
FIG. 7 schematically illustrates a sequence of movements for processing a wafer.

As illustrated in FIG. 7, in each case a separate drive for a direction reversal must be provided at two opposite edges of a table 6 for the swath-by-swath, meander-shaped processing of a wafer 7 placed on a table 6. Thus, table 6 is able to be moved quickly back and forth, and at the end of a movement, in each case the direction is reversed.

In the upper half of FIG. 7, the typical meander-shaped processing paths 7.1 are illustrated, which ultimately determine the sequence of movements of table 6. During the long movements in the X-direction, forces of less than, e.g., 1 N, which are applied by the drive for XY-table 6 described with reference to FIGS. 1 to 4, are sufficient for the compensation of disturbances and the closed-loop control of the direction and the velocity, just as the altogether 100 N, for example, are sufficient to hold the table in suspension. The swath jump in the Y-direction is also managed with, e.g., less than one Newton and may be applied by this drive. For the direction reversal, however, markedly higher forces are necessary, for example, 200 N. They must be applied by the separate drive for reversing the direction of table 6.

As illustrated in FIG. 7, the swaths in the X-direction are longest, for instance, in the middle of wafer 7 (in relation to the Y-direction), while at the beginning and toward the end of the processing, they are markedly shorter. In order to save time for sections of table 6 covered unnecessarily, the two separate drives for the direction reversal in the X-direction are adjustable. Therefore, in the lower half of FIG. 7, paths 15 are illustrated, on which the two separate drives for direction reversal move while table 6 is moving back and forth between them. The longer the swath to be processed on wafer 7, the further away the two drives for the direction reversal are from each other.

Because of the high reaction forces which act on magnetic yoke 10 of a separate drive for the direction reversal, it is advisable to take these reaction forces into account such that they have no effect on table 6 or tool 8.

For example, this may be accomplished with the aid of a separate force frame, via which the magnetic yokes 10 are connected directly to the ground, whereas the U-shaped yokes 1 of the drives of the XY-table 6 are connected to a granite stone, on which the respective machine is mounted, and which is insulated with respect to the ground, often even actively against vibrations.

Alternatively, the reaction forces may move a balance mass back and forth, so that the forces remain completely within the system, and at the same time, reach neither table 6 nor tool 8. The foundation thus remains free of vibrations, as well.

What is claimed is:

1. A drive for an XY-table, comprising:
    a stationary, ferromagnetic and U-shaped yoke having a first limb and a second limb that are located together in a plane;
    movable ferromagnetic bar; and
    a coil;
    wherein the yoke and the bar are adapted to carry a magnetic circuit with a magnetic flux that takes a path across air gaps between the limbs and the bar, and causes vertical reluctance forces in the air gaps that counteract a gravitational force of the bar;
    wherein the bar is parallel to and below the plane;
    wherein the yoke includes a permanent magnet adapted to generate the magnetic flux, the permanent magnet arranged in a closed end, joining the first and second limbs of the U-shaped yoke; and
    wherein the coil is wound about the closed end of the yoke and is adapted to influence the magnetic flux so that a vertical reluctance force acting on the bar is adjustable.

2. The drive according to claim 1, further comprising a controller adapted to control a current through the coil, so that the air gap between the bar and the limbs is adjustable to a setpoint value.

3. The drive according to claim 1, wherein at least one of the two limbs is wrapped by a second coil adapted to generate a horizontal force in a direction of the limbs onto the bar, the horizontal force being adjustable in strength and direction.

4. The drive according to claim 3, wherein a maximum travel range of the bar relative to the yoke is determined by a length of the second coil on the limb.

5. An XY-table, comprising:
    a plurality of drives, each drive including:
    a stationary, ferromagnetic and U-shaped yoke having a first limb and a second limb that are located together in a plane;
    a movable ferromagnetic bar; and
    a coil;
    wherein the yoke and the bar are adapted to carry a magnetic circuit with a magnetic flux that takes a path across air gaps between the limbs and the bar, and causes vertical reluctance forces in the air gaps that counteract a gravitational force of the bar;

wherein the bar is parallel to and below the plane;

wherein at least one of the two limbs is wrapped by a coil adapted to generate a horizontal force in a direction of the limbs onto the bar, the horizontal force being adjustable in strength and direction;

wherein the bars of the drives are mounted on a table;

wherein the table is movable in all six degrees of freedom due to the vertical and horizontal forces acting on the bars;

wherein the yoke includes a permanent magnet adapted to generate the magnetic flux, the permanent magnet arranged in a closed end, joining the first and second limbs of the U-shaped yoke; and wherein the coil is wound about the closed end of the yoke and is adapted to influence the magnetic flux so that a vertical reluctance force acting on the bar is adjustable.

6. The XY-table according to claim 5, wherein the table is arranged in a plane parallel to the plane of the limbs of the drives.

7. The XY-table according to claim 5, wherein the limbs of all drives are oriented in the same direction, and wherein the bar is oriented to the direction of the corresponding limbs at an angle different from 90 degrees.

8. The XY-table according to claim 5, further comprising a separate drive adapted to reversing the direction of movement the table, the separate drive including a ferromagnetic rib that projects at an edge of the table and extends perpendicular to the direction of movement of the table, and a magnetic yoke adapted to receive the rib when the table is near a reversing point, free ends of the magnetic yoke having pole shoes adapted to concentrate a magnetic flux in the yoke, switchable by a reversal coil, in an air gap, through which the rib arrives in an interior of the yoke.

9. The XY-table according to claim 8, wherein the rib is arranged on a non-ferromagnetic projection of the table.

10. The XY-table according to claim 8, wherein ribs and magnetic yokes, having pole shoes, and reversal coils are arranged on both sides of the table in the direction of movement, so that the table is movable back and forth in the direction of movement.

11. The XY-table according to claim 10, wherein a distance between the two magnetic yokes and between the reversal points of the table is adjustable.

12. An XY-table, comprising:

a plurality of drives, each drive including:

a stationary, ferromagnetic and U-shaped yoke having a first limb and a second limb that are located together in a plane; and a movable ferromagnetic bar;

wherein the yoke and the bar are adapted to carry a magnetic circuit with a magnetic flux that takes a path across air gaps between the limbs and the bar, and causes vertical reluctance forces in the air gaps that counteract a gravitational force of the bar;

wherein the bar is parallel to and below the plane;

wherein at least one of the two limbs is wrapped by a coil adapted to generate a horizontal force in a direction of the limbs onto the bar, the horizontal force being adjustable in strength and direction;

wherein the bars of the drives are mounted on a table;

wherein the table is movable in all six degrees of freedom due to the vertical and horizontal forces acting on the bars;

the XY-table further comprising a separate drive adapted to reversing the direction of movement the table, the separate drive including a ferromagnetic rib that projects at an edge of the table and extends perpendicular to the direction of movement of the table, and a magnetic yoke adapted to receive the rib when the table is near a reversing point, free ends of the magnetic yoke having pole shoes adapted to concentrate a magnetic flux in the yoke, switchable by a reversal coil, in an air gap, through which the rib arrives in an interior of the yoke.

13. The XY-table according to claim 12, wherein the rib is arranged on a non-ferromagnetic projection of the table.

14. The XY-table according to claim 13, wherein ribs and magnetic yokes, having pole shoes, and reversal coils are arranged on both sides of the table in the direction of movement, so that the table is movable back and forth in the direction of movement.

15. The XY-table according to claim 14, wherein a distance between the two magnetic yokes and between the reversal points of the table is adjustable.

\* \* \* \* \*